Aug. 10, 1965 I. G. AKMENKALNS 3,200,257

TUNNEL DIODE SWITCHING CIRCUIT

Filed March 30, 1960 2 Sheets-Sheet 1

*INVENTOR.*
IVARS G. AKMENKALNS

*BY* G. R. Gugger
*AGENT*

| OPERATING PATH | CURRENT |
|---|---|
| STATE 1: A | Ib0 |
| TRANSITION: A, B, D, E | Ib0→Ib3 |
| STATE 2: E | Ib3 |
| TRANSITION: E, D, C, A | Ib3→Ib0 |

| OPERATING PATH | CURRENT |
|---|---|
| STATE 1: B | Ib1 |
| TRANSITION: B, D, E, D, C | Ib1→Ib3→Ib1 |
| STATE 2: C | Ib1 |
| TRANSITION: C, A, B | Ib1→Ib0→Ib1 |

United States Patent Office 3,200,257
Patented Aug. 10, 1965

3,200,257
TUNNEL DIODE SWITCHING CIRCUIT

Ivars G. Akmenkalns, Endicott, N.Y., assignor to International Business Machines Corporation, New York, N.Y., a corporation of New York Filed Mar. 30, 1960, Ser. No. 18,690
5 Claims. (Cl. 307—88.5)

This invention relates to a semiconductor control circuit and more particularly to a circuit for controlling the switching of a negative resistance semiconductor device.

In recent years there has been observed a negative resistance region in the forward bias characteristic of a heavily doped P–N junction diode. This phenomena has been attributed to the well-known quantum mechanical tunneling effect and semiconductor diodes with this property have since been known as tunnel diodes. Considerable interest in the tunnel diode has been generated by the electronic industry because it has many desirable characteristics not common to other semiconductor devices. For example, the tunnel diode has the possibility of very fast switching, a natural advantage for a component in high speed computers. In addition, it can operate over a very wide temperature range, withstands nuclear radiation much better than other semiconductor components and is inherently a low-noise device that does not interfere with the intelligence of the electrical signal being developed.

The use of the tunnel diode in some type of circuitry, such as a switching circuit, requires some type of a load with the diode. The simplest load that can be used is a resistor in series with the diode, and in the voltage-current characteristic, this forms a load line which crosses the characteristic at one or more points. The conventional method of switching the tunnel diode between the two positive resistance regions, when used with a resistive load, consists of changing either the total resistance or the resistor return voltage supply. On the diode voltage-current characteristic, this would correspond to shifting the load line in the current direction parallel to its steady state position with the diode characteristic fixed. This method of switching of the diode is obviously unsuited for high speed computer applications.

The switching or a two terminal device presents circuit complications, such as power steering, large input time constants, and increased input power requirements to offset any increase in source resistance. In an effort to overcome switching circuit problems of this nature, it has been found that a transistor triode may be used as a coupling element to switch the tunnel diode. In the present improved control circuit, a transistor triode having a grounded emitter configuration is connected in parallel with a tunnel diode and the composite unit output characteristic corresponds to the tunnel diode characteristic, i.e. the composite unit exhibits two positive resistance regions separated by one negative resistance region. By varying the base current to the transistor, the diode may be switched between the positive resistance regions, and actually the composite unit effectively provides infinitely many tunnel diode characteristic curves all shifted in the increasing current direction, under control of the transistor base current, with the load line fixed. The use of the transistor not only enables control of the tunnel diode but additionally provides isolation between individual circuits and power gain.

Accordingly, a principal object of the present invention is to provide a control circuit for controlling the switching of a two terminal negative resistance device.

A further object of the present invention is to provide a control circuit including a transistor triode for controlling the switching of a tunnel diode.

A still further object is to provide a control circuit operable to produce a plurality of tunnel diode characteristic curves all shifted in the increasing current direction with a fixed load line.

The foregoing and other objects, features and advantages of the invention will be apparent from the following more particular description of preferred embodiments of the invention, as illustrated in the accompanying drawings.

Figure 3:
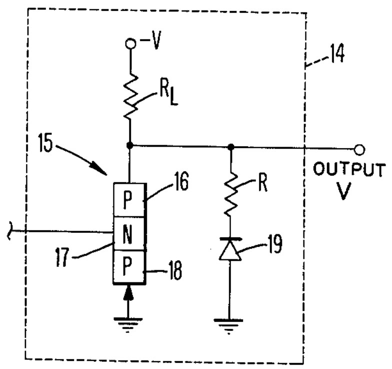
FIG. 3 shows a composite circuit including a tunnel diode and a transistor triode connected in parallel in accordance with the principles of the present invention.

FIGS. *6a–6c* illustrate several modes of operation of the composite circuit of FIG. 3 with various input networks applied.

Figure 7:
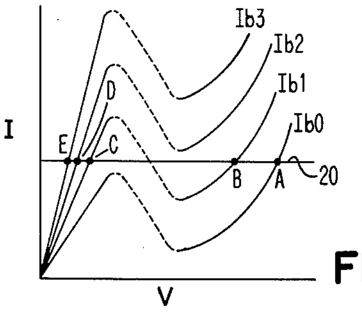

FIG. 7 indicates the operating points of the circuit shown in FIG. 3 with the input networks of either FIG. *6a* or *6b* applied.

Figure 8:
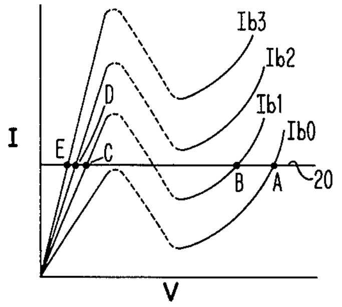

FIG. 8 indicates the operating points of the circuit shown in FIG. 3 with the input network of FIG. *6c* applied.

Figure 1:
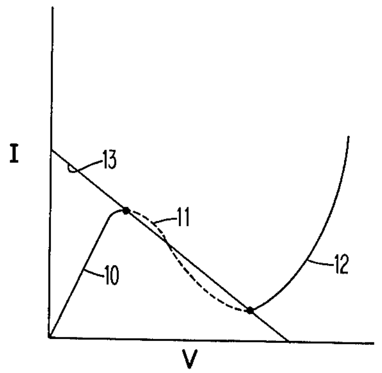
FIG. 1 shows the voltage-current characteristic curve of a tunnel diode.
Figure 2:
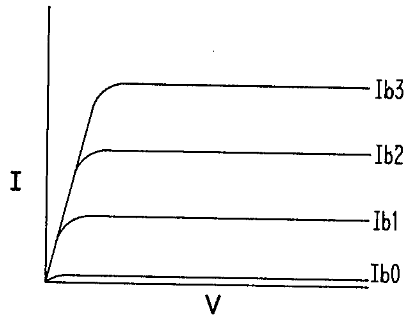
FIG. 2 shows a plurality of voltage-current characteristic curves of a conventional common emitter transistor triode.

Referring to FIG. 1, there is shown the voltage-current characteristic curve for a tunnel diode wherein the characteristic comprises a positive resistance region 10, a negative resistance region 11, shown in dotted form, and another positive resistance region 12. A variable load line 13 is shown intersecting the characteristic curve at the points separating the positive and negative resistance regions, at which points the diode will switch from one stable state to another, and switching of the diode can only be accomplished by varying the load or changing the voltage. It is in the dotted negative resistance region that the tunneling effect of the diode is active to produce the peculiar decreasing current condition with an increase in forward bias voltage. In FIG. 2, there is shown the voltage-current characteristics for a conventional common-emitter transistor triode for different values of base current Ib0–Ib3.

In accordance with the present invention, a tunnel diode and a common-emitter transistor triode are combined into a composite device as shown within the dotted block 14 in FIG. 3. The composite circuit comprises the transistor triode 15 having a collector electrode 16, a base electrode 17, and an emitter electrode 18. The collector is returned to a source of negative voltage through a load resistor $R_L$, and the emitter is shown connected to ground. Connected between the load resistor $R_L$ and ground and in parallel with the transistor is a two terminal negative resistance tunnel diode 19. A resistor R is connected in series with the diode to insure that the transistor 18 will share current. Tunnel diode 19 being connected in parallel with the emitter-collector electrodes of the transistor will depend directly on the voltage drop across the transistor for switching from one stable state to another and it is evident that controlled switching may be obtained by controlling the base current of the transistor.

Because of the negative resistance properties of the tunnel diode, the response of the composite circuit approaches the response of the tunnel diode. The transistor cannot have a negative output resistance at low voltages and the two terminal device has a fixed characteristic.

Figure 4:
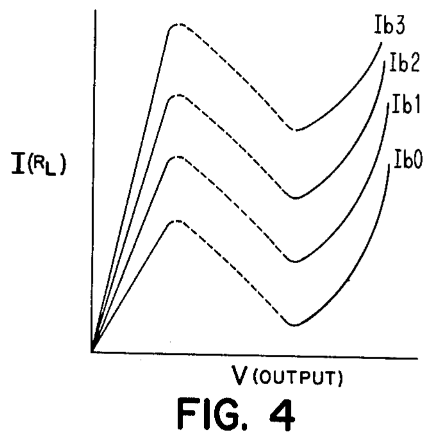
FIG. 4 shows a plurality of voltage-current characteristic curves for the composite circuit shown in FIG. 3.

The shunt combination of the transistor and the diode can have a composite characteristic with a controllable negative resistance region. By maintaining a constant voltage across the device, from collector to ground, and varying the base current of the transistor, a new family of characteristic curves for the composite circuit are developed which reflect the current flow in the load resistor $R_L$. The characteristic curves for the composite circuit are shown in FIG. 4 wherein the curves labeled Ib0 through Ib3 correspond to the transistor characteristic curves similarly labeled in FIG. 2. The curve Ib0 corresponds to the lowest conduction state of the transistor and is substantially identical to the diode curve shown in FIG. 1. The composite unit will effectively provide a plurality of tunnel diode curves all shifted in the increasing current direction under control of the transistor base current. The characteristic curve Ib0 is for all practical purposes the characteristic curve of the series conductive path comprising the resistor R and the tunnel diode 19 because the transistor 15 is cut off. Since it has a negative resistance region it follows that the minimum negative resistance value of the diode 19 exceeds the positive resistance in the series conductive path.

Figure 6A:
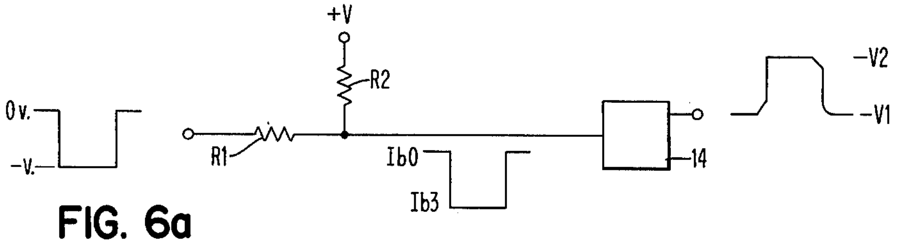
Figure 6B:
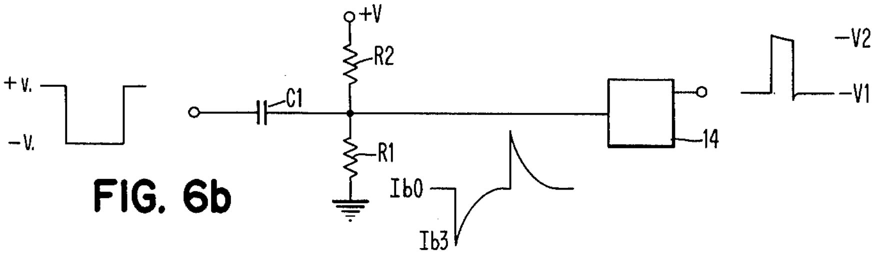
Figure 6C:
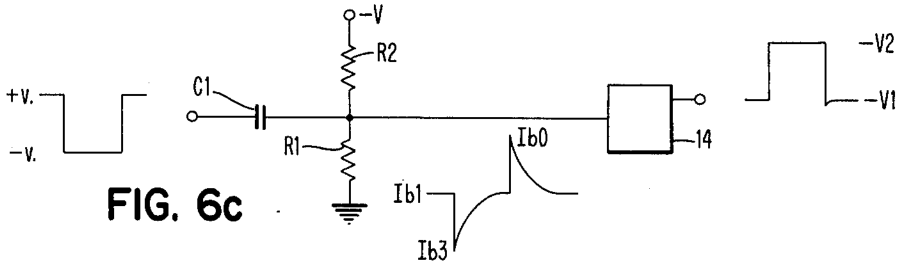

Using different input networks to the transistor 15, several modes of operation of the composite circuit 14 of FIG. 3 are possible as indicated in FIGS. 6*a* through 6*c*. In FIG. 6*a*, there is shown an inverter-pulse shaper circuit having a negative going input voltage pulse for controlling the base current of the transistor. In the normal steady state condition with the input pulse at 0V, composite unit 14 is biased at current level Ib0 and referring to FIG. 7, which shows the characteristic curves and operating points for the circuit of FIG. 6*a* with a fixed linear load line 20, it will be seen that only one stable point A exists. Ib0 corresponds to the lowest conduction state of the transistor and the transistor is essentially off with reverse base current flowing into the base. The tunnel diode is drawing substantially full current and the output voltage level is —V1. When the input voltage drops from 0V to —V, the input current to the base of the transistor drops from Ib0 to Ib3 and the transistor swings into conduction. As the transistor approaches saturation, the voltage differential across the tunnel diode decreases and the transistor carries substantially all of the current flow. The positive going output pulse from the composite unit will reach a level of —V2 which is the saturation voltage of the composite device and which, for the circuit shown, will be some 0.03 or 0.05 volt negative with respect to ground.

Figure 5:
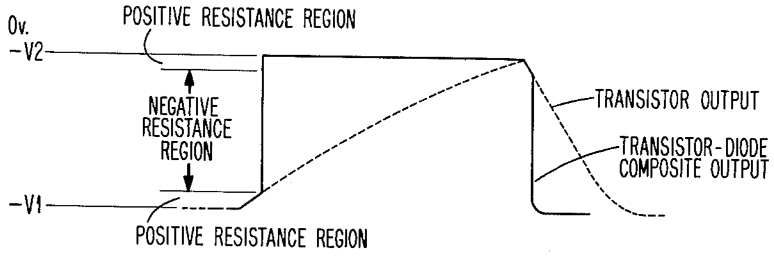
FIG. 5 shows a sample output voltage pulse from a transistor triode compared with a corresponding sample output voltage pulse from the composite circuit shown in FIG. 3.

Referring to FIG. 7, it may be seen that as the transistor base current I increases from Ib0 to Ib3, the resulting decrease in voltage V across the diode will cause the composite unit to switch from stable point A through points B, D, and E where it will remain until the base current is reduced. When the input voltage rises from —V back up to 0V, the transistor base curent will decrease from Ib3 to Ib0, and the unit will switch from stable point E back through points D and C to point A. The effective switching speed of the composite unit is illustrated in FIG. 5, which shows a comparison between the output pulse of the composite circuit 14 with the input network of FIG. 6*a* applied and the output pulse of the transistor alone. It can be seen that in the low voltage positive resistance region of the diode, the output rise follows the exponential characteristic of the transistor until the negative resistance region is encountered at which point the voltage takes a sharp instantaneous rise to —V2 where it remains until the unit is switched back. On switchback, the high output voltage in the positive resistance region drops according to the exponential characteristic of the transistor until the negative resistance region is again countered at which point the voltage now takes a sharp instantaneous drop until the other positive resistance region is encountered at which point the voltage tapers off to the —V1 level following the exponential characteristic of the transistor. What hapens, in effect, is that the diode drags the transistor along as it switches.

In the circuit illustrated in FIG. 6*b*, the network differentiates the input signal so that the base current will return to Ib0 under the control of the network time constants. This type of operation corresponds to a single-shot operation and the operating points correspond to those shown in FIG. 7.

The circuit illustrated in FIG. 6*c* provides the required control current for a bistable operation and the operating points are shown in FIG. 8. The unit is biased in the steady state to Ib1 and has two stable points B and C. If the unit is initially at B, a temporary increase of the base current to Ib3 will switch it to point E, and as the base current falls back to Ib1, the unit will switch back to point C and remain there. When the trailing edge of the input voltage pulse is differentiated, the base current is decreased from Ib1 to Ib0, and the unit will switch to point A and then settle to point B as the base current rises back to Ib1. This operation may be compared to a latch or flip-flop operation.

While the invention has been particularly shown and described with reference to preferred embodiments thereof, it will be understood by those skilled in the art that various changes in form and details may be made therein without departing from the spirit and scope of the invention.

What is claimed is:

1. A high speed switching circuit comprising
a composite device including
a conductive path having a tunnel diode and having a pair of end terminals, wherein the minimum absolute value of negative resistance between the terminals exceeds the absolute value of the positive resistance between the terminals,
a resistor having a first terminal connected to one terminal of the path and having a second terminal,
a source of operating potential having one terminal connected to the other terminal of the path and having another terminal connected to the second terminal of the resistor forward biasing the diode to permit stable operation at least in its high voltage region, and
a transistor having base and emitter electrodes and a collector electrode connected directly to the one terminal of the path to provide a family of tunnel diode type characteristic curves at the collector electrode which shift in the increasing and decreasing current direction as a function of increasing and decreasing current in the base electrode, which family of curves defines high and low voltage, positive resistance regions of composite device operation separated by a negative resistance region,
said resistor and source defining a fixed load line which intersects, at one point only, the characteristic curve defined by composite device when the transistor is in its nonconductive state; and
means for increasing and decreasing the base current in the transistor to predetermined levels;
said transistor responsive to said means for operating the composite device in its low and high voltage regions when the base current is increased and decreased respectively.

2. A high speed switching circuit comprising
a composite device including
a conductive path having a tunnel diode and having a pair of end terminals, said path having a characteristic curve consisting of a pair of positive resistance regions separated by a negative resistance region,
a resistor having a first terminal connected to one terminal of the path and having a second terminal,
a source of operating potential having one terminal connected to the other terminal of the path and having another terminal connected to the second terminal of the resistor forward biasing the diode to permit stable operation at least in its high voltage region, and a transistor having base and emitter electrodes and a collector electrode connected directly to the one terminal of the path to provide a family of tunnel diode type characteristic curves at the collector electrode which shift in the increasing and decreasing current directions as a function of increasing and decreasing current in the base electrode, which family of curves defines high and low voltage, positive resistance regions of composite device operation separated by a negative resistance region, said resistor and source defining a fixed load line which intersects, at one point only, the characteristic curve defined by composite device when the transistor is in its nonconductive state; and means for increasing and decreasing the base current in the transistor to predetermined levels;

said transistor responsive to said means for operating the composite device in its low and high voltage regions when the base current is increased and decreased respectively.

3. A high speed switching circuit comprising a composite device including a transistor amplifier having base, emitter and collector electrodes, a conductive path having a tunnel diode and having first and second end terminals directly connected respectively to the emitter and collector electrodes, said path having a minimum absolute value of negative resistance which exceeds the absolute value of the positive resistance therein, a source of operating potential for the amplifier and diode, and a resistor connecting the source in a reverse bias sense to the collector electrode and in a forward bias sense to the tunnel diode to provide a family of tunnel diode type characteristic curves at the collector electrode which shift in the increasing and decreasing current direction as a function of increasing and decreasing current in the base electrode, which family of curves defines high and low voltage, positive resistance regions of composite device operation separated by a negative resistance region, said resistor and source defining a fixed load line which intersects, at one point only, the characteristic curve defined by the composite device when the transistor is in its nonconductive state; and means for increasing and decreasing current in the base electrode to predetermined levels;

said transistor responsive to said means for selectively operating the composite device in the low and high voltage regions when the base current is increased and decreased respectively.

4. A high speed switching circuit comprising a composite device including a transistor amplifier having base, emitter and collector electrodes, a conductive path including a tunnel diode connected directly across the emitter and collector electrodes, said path having a minimum absolute value of negative resistance which exceeds the absolute value of its positive resistance, a source of operating potential for the amplifier and diode, and a resistor connecting the source in a reverse bias sense to the collector electrode and in a forward bias sense to the tunnel diode to provide a family of tunnel diode type characteristic curves at the collector electrode which shift in the increasing and decreasing current direction as a function of increasing and decreasing current in the base electrode, which family of curves defines high and low voltage, positive resistance regions of composite device operation separated by a negative resistance region, said resistor and source defining a fixed load line which intersects, at one point only, the characteristic curve defined by the composite device when the transistor is in its nonconductive state;

means biasing the amplifier at the intersection of the load line and a selected one of said family of curves which intersects the load line at one point only to operate the composite device in one of said voltage regions; and means for applying signals to the base electrode;

said transistor responsive to said signals for operating the device in the other of said voltage regions while said signals are applied at a sufficient level.

5. A high speed bistable switching circuit comprising a composite device including a transistor amplifier having base, emitter and collector electrodes, a conductive path including a tunnel diode connected directly across the emitter and collector electrodes, said path having a minimum absolute value of negative resistance which exceeds the absolute value of its positive resistance, a source of operating potential for the amplifier and diode, and a resistor connecting the source in a reverse bias sense to the collector electrode and in a forward bias sense to the tunnel diode to provide a family of tunnel diode type characteristic curves at the collector electrode which shift in the increasing and decreasing current direction as a function of increasing and decreasing current in the base electrode, which family of curves defines high and low voltage, positive resistance regions of composite device operation separated by a negative resistance region, said resistor and source defining a fixed load line which intersects, at one point only, the characteristic curve defined by the composite device when the transistor is in its nonconductive state;

means biasing the amplifier at the intersection of the load line and a selected one of said family of curves which intersects the load line at two points to operate the composite device alternatively in one or the other of said voltage regions; and means for applying signals to the base electrode to increase and decrease current in the base electrode;

said transistor responsive to said increasing and decreasing base current for selectively switching the composite device respectively to the low and high voltage regions.

References Cited by the Examiner

UNITED STATES PATENTS

| | | | |
|---|---|---|---|
| 2,105,081 | 1/38 | Jobst et al. | 333—80 |
| 2,877,416 | 3/59 | Grisdale | 324—83 |
| 2,920,214 | 1/60 | Moore | 307—88.5 |
| 3,094,630 | 6/63 | Rapp et al. | 307—88.5 |
| 3,102,209 | 8/63 | Pressman | 307—88.5 |

OTHER REFERENCES

Publication II: "1960 International Solid State Circuits Conference," sponsored by A.I.E.E and I.R.I., February 1960, pages 52–53.

Publication I: "Electronics," Nov. 27, 1959, pages 60–64.

Shea: "Transistor Circuit Engineering," John Wiley & Sons, New York, 1957, page 60.

JOHN W. HUCKERT, *Primary Examiner.*

HERMAN KARL SAALBACH, *Examiner.*